(12) United States Patent
Gupta et al.

(10) Patent No.: US 8,871,025 B2
(45) Date of Patent: Oct. 28, 2014

(54) SIC SINGLE CRYSTALS WITH REDUCED DISLOCATION DENSITY GROWN BY STEP-WISE PERIODIC PERTURBATION TECHNIQUE

(75) Inventors: Avinash Gupta, Basking Ridge, NJ (US); Utpal K. Chakrabarti, Allentown, PA (US); Jihong Chen, St. Charles, MO (US); Edward Semenas, Allentown, PA (US); Ping Wu, Warren, NJ (US)

(73) Assignee: II-VI Incorporated, Saxonburg, PA (US)

( * ) Notice: Subject to any disclaimer, the term of this patent is extended or adjusted under 35 U.S.C. 154(b) by 1080 days.

(21) Appl. No.: 12/441,583

(22) PCT Filed: Sep. 27, 2007

(86) PCT No.: PCT/US2007/079694
§ 371 (c)(1),
(2), (4) Date: Oct. 7, 2009

(87) PCT Pub. No.: WO2008/039914
PCT Pub. Date: Apr. 3, 2008

(65) Prior Publication Data
US 2010/0031877 A1 Feb. 11, 2010

Related U.S. Application Data

(60) Provisional application No. 60/847,422, filed on Sep. 27, 2006.

(51) Int. Cl.
*C30B 28/14* (2006.01)
*C30B 29/36* (2006.01)
*C30B 23/00* (2006.01)

(52) U.S. Cl.
CPC ............... *C30B 29/36* (2013.01); *C30B 23/002* (2013.01); *C30B 23/005* (2013.01)
USPC ................. 117/109; 117/2; 117/89; 117/105; 117/108

(58) Field of Classification Search
USPC ................ 117/2, 89, 105, 108, 109
See application file for complete search history.

(56) References Cited

U.S. PATENT DOCUMENTS

| 5,937,317 A | 8/1999 | Barrett et al. |
| 6,336,971 B1 | 1/2002 | Nagato et al. |

(Continued)

FOREIGN PATENT DOCUMENTS

JP 2000104162 4/2000

OTHER PUBLICATIONS

Wellmann et al.; "Basal Plane Dislocation Dynamics in Highly p-Type Doped Versus Highly n-Type doped SiC"; Materials Science Forum; 2006; pp. 79-82; vols. 527-529; Trans Tech Publications, Switzerland.

(Continued)

*Primary Examiner* — Bob M Kunemund
(74) *Attorney, Agent, or Firm* — The Webb Law Firm

(57) ABSTRACT

In a crystal growth method, a seed crystal 8 and a source material 4 are provided in spaced relation inside of a growth crucible 6. Starting conditions for the growth of a crystal 14 in the growth crucible 6 are then established therein. The starting conditions include: a suitable gas inside the growth crucible 6, a suitable pressure of the gas inside the growth crucible 6, and a suitable temperature in the growth crucible 6 that causes the source material 4 to sublimate and be transported via a temperature gradient in the growth crucible 6 to the seed crystal 8 where the sublimated source material precipitates. During growth of the crystal 14 inside the growth crucible 6, at least one of the following growth conditions are intermittently changed inside the growth crucible 6 a plurality of times: the gas in the growth crucible 6, the pressure of the gas in the growth crucible 6, and the temperature in the growth crucible 6.

16 Claims, 7 Drawing Sheets

(56) References Cited

U.S. PATENT DOCUMENTS

| | | |
|---|---|---|
| 6,600,203 B2 | 7/2003 | Takahashi et al. |
| 6,773,505 B2 | 8/2004 | Kuhn et al. |
| 2002/0072249 A1 | 6/2002 | Nagasawa et al. |
| 2002/0083885 A1 | 7/2002 | Kuhn et al. |
| 2004/0250747 A1* | 12/2004 | Sasaki et al. ............ 117/2 |

OTHER PUBLICATIONS

Zhang et al.; "Structure of Carrot Defects in 4H-SiC Epilayers"; Material Science Forum; 2006; pp. 327-332; vols. 527-529; Trans Tech Publications, Switzerland.

Powell et al.; "Surface Morphology of Silicon Carbide Epitaxial Films"; Journal of Electronic Materials; 1995; pp. 295-301; vol. 24, No. 4.

Lendenmann et al.; "Long Term Operation of 4.5kV PiN and 2.5kV JBS Diodes"; Material Science Forum; 2001; pp. 353-356; vols. 727-730; Trans Tech Publications, Switzerland.

Sumakeris et al.; "Bulk Crystal Growth, Epitaxy, and Defect Reduction in Silicon Carbide Materials for Microwave and Power Devices"; MRS Bulletin; Apr. 2005; pp. 280-286; vol. 30.

Nakamura et al.; "Ultrahigh-Quality Silicon Carbide Single Crystals"; Nature; Aug. 26, 2004; pp. 1009-1012; vol. 430.

Neudeck et al.; "Breakdown Degradation Associated with Elementary Screw Dislocations in 4H-SiC p+n Junction Rectifiers"; Solid-State Electronics; 1998; pp. 2157-2164; vol. 42, No. 12.

* cited by examiner

WAFER #2

WAFER #17

SIC SINGLE CRYSTALS WITH REDUCED DISLOCATION DENSITY GROWN BY STEP-WISE PERIODIC PERTURBATION TECHNIQUE

BACKGROUND OF THE INVENTION

1. Field of the Invention

The present invention relates to sublimation growth of silicon carbide single crystals with low dislocation density.

2. Description of Related Art

Silicon carbide is an important wide-bandgap material used for the development and manufacturing of SiC and GaN semiconductor devices of new generation. While GaN-based devices are intended for the operation at microwave frequencies, SiC-based devices are aimed at efficient power switching. Other applications are also envisioned and are emerging. Silicon carbide is used as a lattice-matched substrate material to grow epitaxial layers of SiC and GaN. In order to produce low-defect epilayers and high-quality devices, the substrate must have good crystal quality, including low dislocation density.

Dislocations are one-dimensional crystal defects. They are generally categorized based on the value and direction of the so-called Burgers vector, which represents the magnitude and direction of the lattice distortion of dislocation in a crystal lattice, and a direction of a dislocation line. In silicon carbide, dislocations with their lines extending along the crystallographic c-direction are called threading. These include threading screw dislocations (TSD) and threading edge dislocations (TED), which have their Burgers vector not exceeding 1 or 2 lattice parameters. Micropipes are hollow-core threading screw dislocations with a larger Burgers vector, reaching in some cases hundreds of lattice parameters. Dislocations with their lines parallel to the basal c-plane are called basal plane dislocations (BPD).

For the measurements of the dislocation density in SiC, etching in molten KOH is generally employed to reveal dislocation-related etch pits. Often, the nature of the particular dislocation can be determined based on the characteristic shape of the etch pit. A photograph of an etched SiC surface (c-plane) is shown in FIG. 1. In general, etch pits due to TSDs are hexagonal and somewhat larger than those due to TEDs, which often appear more rounded. Etch pits due to BPDs are usually elongated and asymmetrical.

As an example, in a typical 7.62 cm diameter PVT grown 4H—SiC substrate, the TED and TSD densities are on the order of $5 \cdot 10^4$ cm$^{-2}$ and $10^4$ cm$^{-2}$, respectively, and the density of BPD can be $10^4$ cm$^{-2}$ or as high as $10^5$ cm$^2$. The total dislocation density can be as high as $3 \cdot 10^5$ cm$^{-2}$. The measured dislocation density depends both on the quality of the crystal and on the way wafers extracted from the crystal are sliced. Etching can reveal dislocations only if their lines intercept with the surface of the wafer. Therefore, wafers that are sliced parallel to the c-plane (on-axis) tend to exhibit lower densities of BPDs.

Moreover, the shape of etch pits in heavily nitrogen-doped n+SiC substrates are usually not well defined. A fraction of them have clearly elongated shapes and can be designated as BPD, all the rest have near circular shapes.

There are usually no distinctly hexagonal shaped dislocation etch pits. It is possible that this might be related to a low occurrence of screw dislocations in such crystals. More likely, it results from the effect of nitrogen dopant on the etching behavior of SiC, whereupon the distinction between TSD and TED diminishes.

Moreover, these etch pits tend to be slightly asymmetric. This may indicate a basal plane component in these dislocations as suggested in "Basal Plane Dislocation Dynamics in Highly p-Type Doped Versus Highly n-Type Doped SiC", by P. J. Wellman et al., International Conference on Silicon Carbide and Related Materials, 2005, Pittsburgh, or it may simply reflect the impurity induced non-uniformity during etching. As a result, it is difficult to clearly separate different types of dislocations through molten KOH etching methods on these kinds of samples. However, this difficulty does not affect the measurement of total dislocation density.

For 4H—SiC homoepitaxy, an 4H—SiC substrate is generally oriented off its c-plane by 4 or 8 degrees in order to achieve regular step flow and eliminate nucleation of the 3C polytype. Consequently, most of the threading defects and a fraction of BPDs penetrate from the substrate into the epilayer. A large percentage of BPDs convert into TEDs at the interface between the substrate and the epitaxial layer. In addition, new defects can emerge at the substrate-epitaxial layer interface as a result of interaction between various types of dislocations and the step flow. These epitaxial layer defects are detrimental to device performance and include so-called comets and triangles, as reported in "Structure of Carrot Defects in 4H—SiC Epilayers", by X. Zhang et al., International Conference on Silicon Carbide and Related Materials, 2005, Pittsburgh; and "Surface Morphology of Silicon Carbide Epitaxial Films", by J. A. Powell et al., J. Electronic Mat., 24, (1995) p. 295. Although the exact nature of these defects is not yet completely understood, it is believed they are closely related to the dislocations in the substrate.

FIGS. 2A and 2B are magnified photographs of epitaxial surfaces including a comet defect and a triangle defect, respectively. The photographs were taken on samples etched with molten KOH. Therefore, the surfaces also include a number of dislocation-related etch pits. As can be seen, both comet and triangle defects are bounded by dislocations. In particular, the comet is bounded by a TSD at one end and by a BPD at the other end. The triangle is bounded by two or more BPDs.

As is well-known to those skilled in the art of SiC growth and epitaxy, micropipes and dislocations have a detrimental impact on the efficiency and reliability of devices made with SiC, as reported in "Breakdown degradation associated with elementary screw dislocations in 4H—SiC p+n junction rectifiers" by P. D. Neudeck et al., Solid-State Electron. 42, (1998) p. 2157; and "Long term operation of 4.5 kV PiN and 2.5 kV JBS diodes", by H. Lendenmann et al., Material Science Forum 353-356, (2001) p. 727. The reference "Bulk Crystal Growth, Epitaxy, and Defect Reduction of Silicon Carbide Materials for Microwave and Power Devices", by J. J. Sumakeris et al., MRS Bulletin, Vol. 30, April (2005), p. 280 discusses device limitations due to the micropipes, TSDs, TEDs and BPDs that propagate from the substrate into the epi-layer.

In summary, reduction of dislocation density in the SiC substrate is crucial for minimizing the presence of harmful defects in epitaxial layers and for achieving improved characteristics of the devices.

The most common technique used for the growth of SiC single crystals by sublimation is Physical Vapor Transport (PVT). A schematic diagram of a PVT system 2 is shown in FIG. 3. Polycrystalline SiC grain, which serves as a sublimation source material 4, is placed at the bottom of a graphite growth crucible 6 and a SiC seed crystal 8 is attached to a graphite lid or top 10 of crucible 6. Loaded crucible 6 is heated to a growth temperature between 2000 and 2400° C. by way of a resistance heater (resistance heating) or an RF coil 12 (induction heating). A temperature difference is established between the sublimation source material 4 and seed crystal 8 in the presence of a low pressure (1-200 Torr) inert gas, such as helium or argon, inside crucible 6, whereby the temperature of source material 4 is higher than that of seed crystal 8. Under these conditions, source material 4 sublimes and fills the interior of the crucible 6 with a vapor comprised of silicon- and carbon-carrying volatile molecular species, such as $SiC_2$, $Si_2C$ and Si. Driven by the temperature gradient, these species diffuse through the vapor phase in the direction from sublimation source material 4 to seed crystal 8. Due to the lower temperature of seed crystal 8, a supersaturation is created causing condensation of the vapor on seed crystal 8 and growth of a SiC single crystal 14 thereon.

The reference "Ultrahigh-quality silicon carbide single crystals," by Nakamura et al., Nature 430 (2004), p. 1009, discloses growing SiC crystals with very low dislocation density, on the order of 100 $cm^{-2}$, using repeated a-face growth (RAF). This procedure included multiple sublimation growth runs. At each run, the growth direction was turned by 90 degrees. Although dramatically reduced dislocation density was observed, the RAF process is not conducive to volume manufacturing and, thus far, no recognizable body in the SiC crystal growth field has independently repeated or confirmed the results.

The total population of dislocations in SiC crystals can be divided into two groups: dislocations inherited from the seed and those generated during growth. Generation of dislocations during growth is believed to be due to the contamination of the growth interface by particles and other contaminants released from the source and graphite parts. Steep temperature gradients can lead to the excessive thermo-elastic stress and generation of dislocations.

Conventional and well-established measures can be applied to the PVT sublimation growth process in order to eliminate or reduce the generation of dislocations during growth. These measures include better purity of the growth components; degassing and vacuum baking of the graphite furniture and source at elevated temperatures; and moderation of the temperature gradients.

The reference "Basal Plane Dislocation Dynamics in Highly p-Type Doped Versus Highly n-Type Doped SiC", by P. J. Wellmann et al., International Conference on Silicon Carbide and Related Materials, 2005, Pittsburgh, reports the study of the incorporation of an n-type layer during the growth of aluminum doped p-type SiC, using over-compensation by nitrogen, and followed the fraction of BPD in total dislocations through the crystal. The focus of the study was on the comparison between p-type and n-type doped SiC and the effect on BPD. The reference reported the increase in BPD fraction in the inserted n-type layer, and subsequent decrease of the fraction. The effect on the overall level of dislocation density was not reported. Furthermore, as previously discussed, the difference in the observed etch pit morphology between p-type and n-type SiC does not necessarily correspond to the nature of dislocations. It is possible that the etching behavior is modified by different impurities. There is no known technique that could be applied to minimize the propagation of threading dislocations from the seed into the growing crystal.

It would, therefore, be desirable to reduce the dislocation density in the SiC single crystals grown by sublimation and, more specifically, to minimize the propagation of the threading dislocations during growth from the seed into the growing crystal.

SUMMARY OF THE INVENTION

One embodiment of a crystal growth method comprises (a) providing a seed crystal and a source material in spaced relation inside of a growth crucible; (b) establishing in the growth crucible starting conditions for the growth of a crystal therein, said starting conditions comprising: (1) a suitable gas inside the growth crucible, (2) a suitable pressure of the gas inside the growth crucible, and (3) a suitable temperature in the growth crucible that causes the source material to sublimate and be transported via a temperature gradient in the growth crucible to the seed crystal where the sublimated source material precipitates; and (c) intermittently changing at least one of the following growth conditions inside the growth crucible a plurality of times during growth of the crystal: the gas in the growth crucible, the pressure of the gas in the growth crucible, and the temperature in the growth crucible.

In the method, each instance of intermittently changing at least one of the growth conditions can include changing said at least one growth condition from its starting growth condition and then returning said changed growth condition back to its starting growth condition after a period of time. The period of time can be the same or different for each instance of intermittently changing.

The suitable gas in step (b) can include at least one of the following: helium, argon and hydrogen. Changing the gas in step (c) can include adding nitrogen to the suitable gas of step (b).

The suitable gas pressure in step (b) can be a first pressure between 1 Torr and 200 Torr. Changing the pressure of the gas in step (c) can include increasing the gas pressure from the first pressure to a second pressure that is also between 1 Torr and 200 Torr.

The suitable temperature in step (b) can be a first temperature between 2000° C. and 2400° C. Changing the temperature in step (c) can include increasing or decreasing the temperature from the first temperature to a second temperature between 2000° C. and 2400° C.

The growth crucible can be disposed inside of a chamber into which the gas is introduced. The growth crucible can be comprised of a material, such as, without limitation, porous graphite, that is permeable to the gas. The chamber can be comprised of fused silica.

Another embodiment of a crystal growth method comprises (a) providing a growth crucible having polycrystalline source material and a seed crystal disposed in spaced relation therein; (b) heating the interior of the growth crucible such that a temperature gradient forms in the growth crucible between the source material and the seed crystal, the source material is heated to a sublimation temperature and the temperature gradient is sufficient to cause sublimated source material to be transported to the seed crystal where the sublimated source material precipitates on the seed crystal to form a growing crystal; (c) causing a gas to flow into the growth crucible that facilitates the transport of the sublimated source material to the seed crystal and the precipitation of the sublimated source material on the seed crystal; and (d) at plural times during the transport of the sublimated source material to the seed crystal and the precipitation of the sublimated source material on the seed crystal, alternately beginning and then terminating a change in at least one of the following: a mixture of the gas flowing into the growth crucible, a pressure of the gas flowing in growth crucible, and at least one the lowest and highest temperature of the temperature gradient in the growth crucible.

Beginning the change in the mixture of the gas flowing into the growth crucible can include adding to the gas of step (c) another gas that causes at least one of: an increase in the electrical conductivity of the growing crystal, a change in the visible color of the growing crystal, or a change in a lattice parameter of the growing crystal. Terminating the change in the mixture of the gas flowing into the growth crucible can include removing the other gas from the gas flow of step (c).

The other gas can be nitrogen. The gas of step (c) can include at least one of the following: helium, argon and hydrogen.

Beginning the change in the pressure of the gas flowing into the growth crucible can include increasing or decreasing the pressure of the flowing gas from a first gas pressure to a second gas pressure. Terminating the change in the pressure of the gas flowing into the growth crucible can include decreasing or increasing, respectively, the pressure of the flowing gas from the second gas pressure to the first gas pressure. Each gas pressure is desirably between 1 Torr and 200 Torr.

Beginning the change in the at least one of the lowest and highest temperature of the temperature gradient in the growth crucible can include increasing the temperature of the lowest temperature, the highest temperature, or both. Terminating the change in the at least one of the lowest and highest temperature of the temperature gradient in the growth crucible can include decreasing the temperature of the lowest temperature, the highest temperature, or both, back to the temperature(s) at the beginning of said change.

The temperature gradient can be between 10° C. and 50° C., or between 25° C. and 50° C. The lowest temperature of the temperature gradient can be 2000° C. The highest temperature of the temperature gradient can be 2400° C.

DETAILED DESCRIPTION OF THE INVENTION

The following detailed description will be made with reference to the accompanying figures where like reference numbers correspond to like elements.

It has been observed, that sharp perturbations of the SiC single crystal growth process can result in a noticeable reduction in the density of threading dislocations. One desirable way to induce such perturbation is by step-wise doping during growth.

Step-wise doping creates conditions where adjacent layers of the crystal grown in sequence have slightly different lattice parameters. As a result, a lateral stress component is created which forces each threading dislocation to change the direction of its line in order to avoid or eliminate this stress. Desirably, the direction of each dislocation line changes by 90 degrees, i.e., the dislocation from threading becomes basal. Accordingly, the probability for the dislocation to intersect an opposite sign dislocation located nearby increases. In addition, basal plane dislocations thus formed will no longer propagate in the direction of further crystal growth (c-direction). Step-wise doping carried out multiple times during SiC single crystal growth has been observed to significantly lower the dislocation density.

Figure 1:
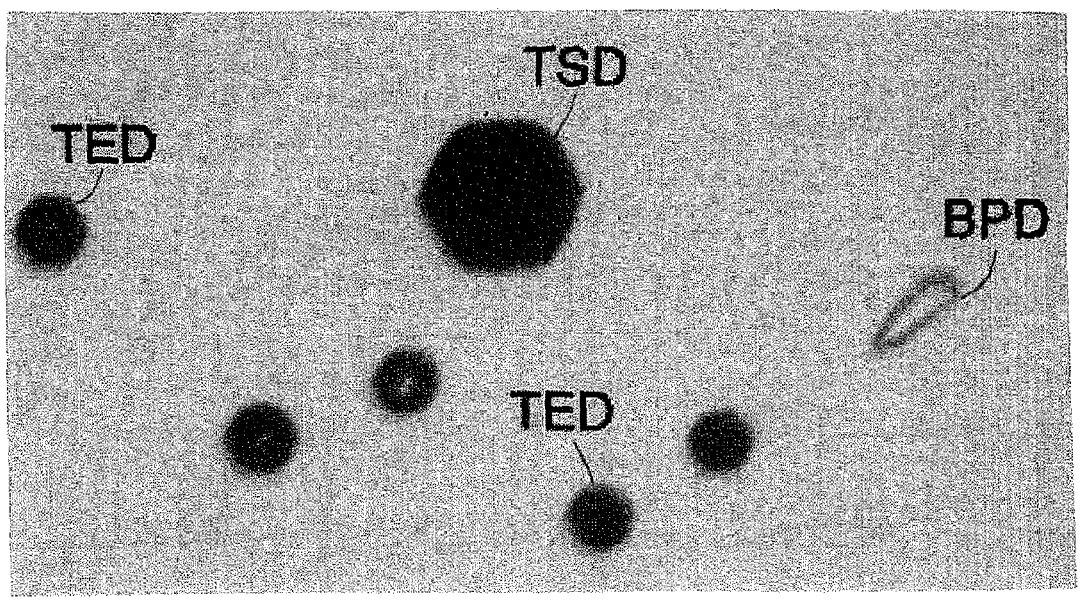
FIG. 1 is a magnified photograph of a potassium hydroxide etched SiC surface (c-plane) showing a threading screw dislocation (TSD), threading edge dislocations (TED) and a basal plane dislocation (BPD)
Figure 2A:
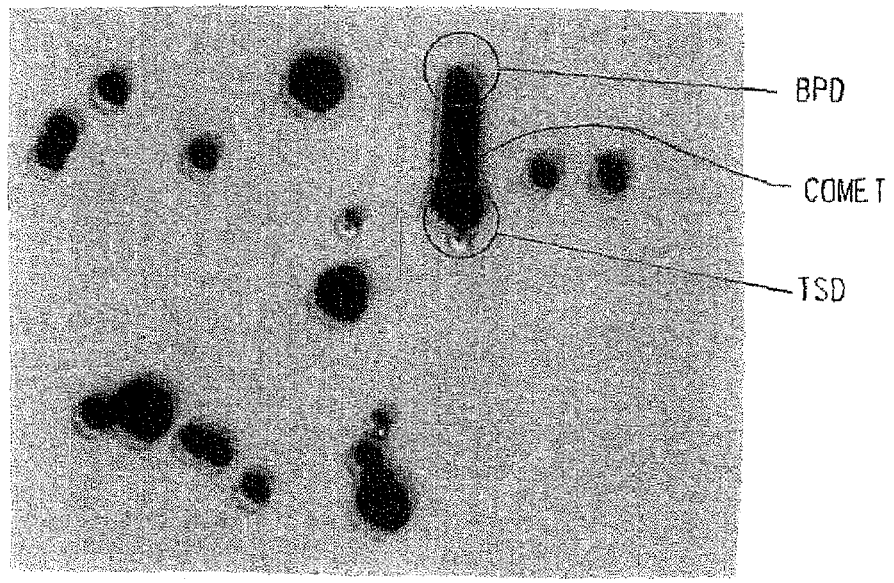
FIGS. 2A and 2B are magnified photographs of potassium hydroxide etched epitaxial surfaces including a comet defect and a triangle defect, respectively.
Figure 2B:
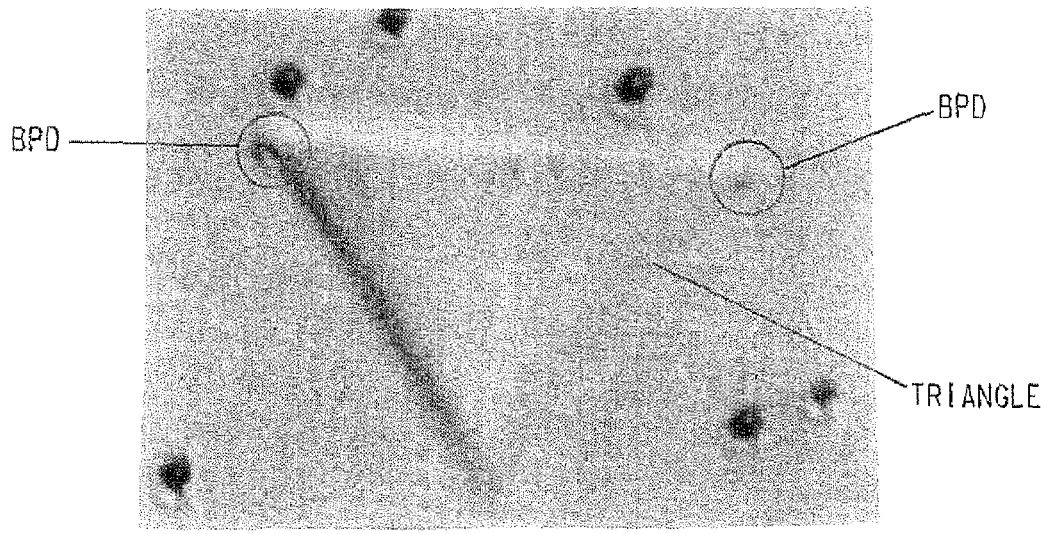
Figure 3:
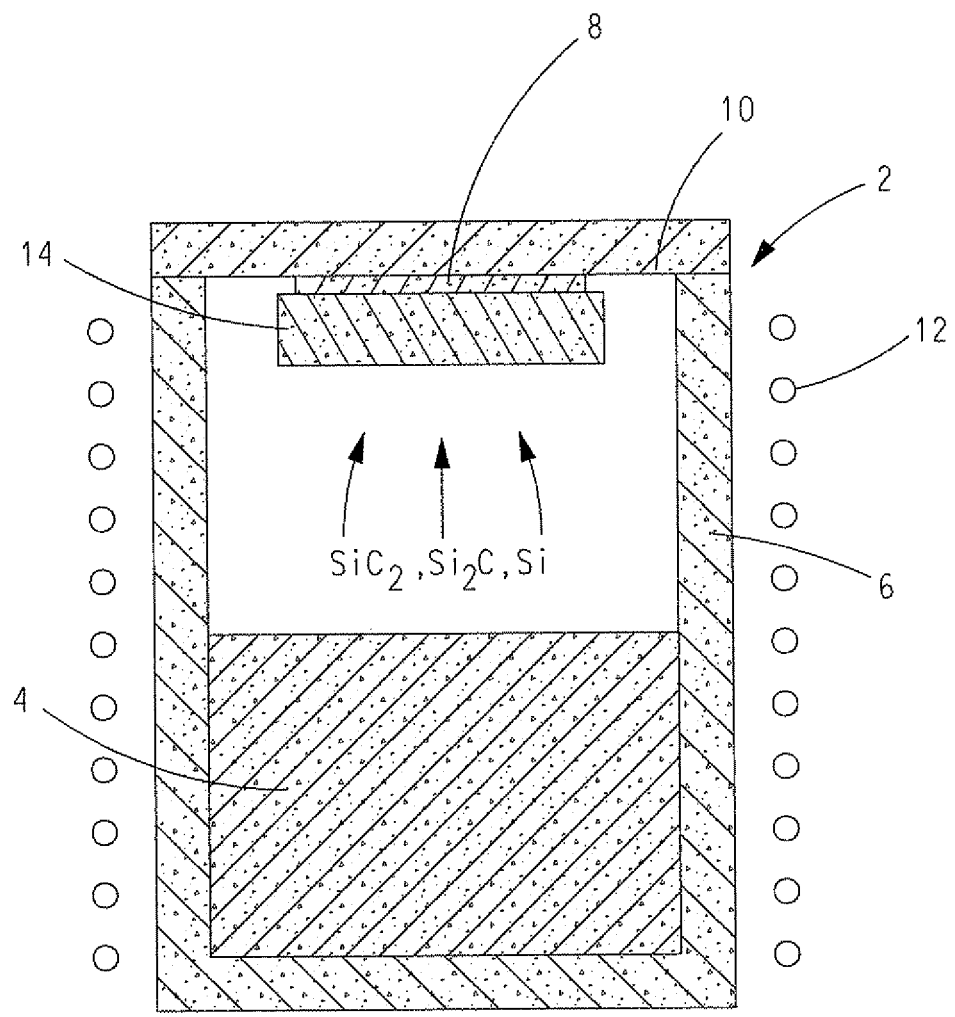
FIG. 3 is a schematic diagram of a physical vapor transport (PVT) system for the growth of SiC single crystals by sublimation.
Figure 4:
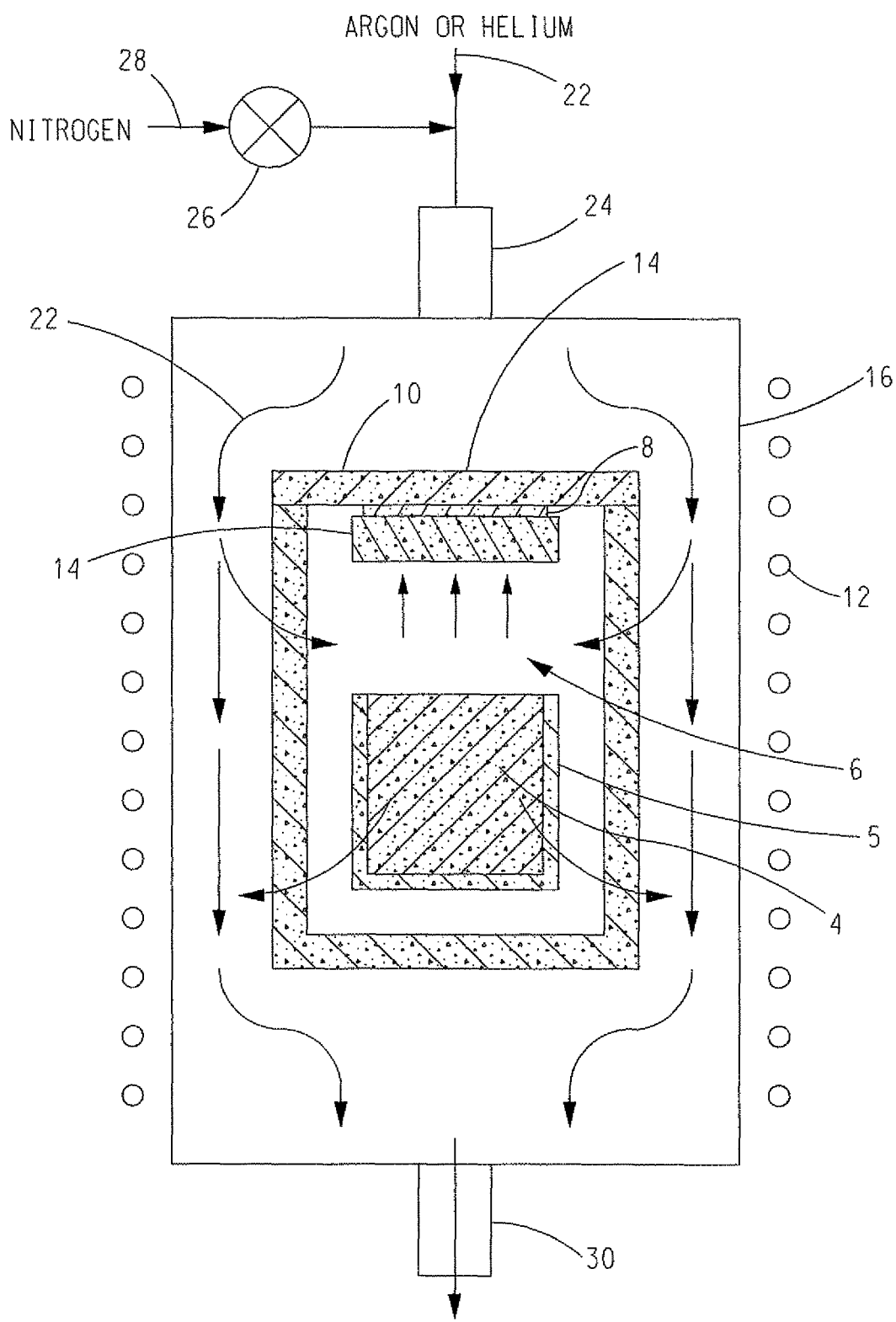
FIG. 4 is a schematic diagram of a PVT system for perturbation growth of SiC single crystals by sublimation in accordance with an embodiment of the present invention.

FIG. 4 is a schematic drawing of one non-limiting embodiment of a system for perturbation growth of SiC single crystals. In FIG. 4, PVT sublimation growth of silicon carbide is carried out in a graphite growth crucible 6 sealed with a graphite lid 10. Desirably, crucible 6 and lid 10 are made of high-density, fine-grain and low-porosity graphite, such as "ATJ" available from Union Carbide Corporation of Danbury, Conn., under registered trademark UCAR® (registration number 1008278), or similar. Growth crucible 6 is loaded with a SiC polycrystalline source material 4 and a single crystal SiC seed crystal 8. Source material 4 is disposed in a lower portion of crucible 6 while seed crystal 8 is disposed at the top of crucible 6, desirably attached to lid 10. Source material 4 can be contained in a thin-walled graphite source crucible 5, which can be disposed spaced from the interior walls and base of crucible 6 (as shown) in any suitable and/or desirable manner. However, this is not to be construed as limiting the invention since it is also envisioned that source material 4 can be disposed in the bottom of crucible 6 as shown in FIG. 3.

Growth crucible 6, loaded with source material 4 and seed crystal 8, is placed inside a sealed chamber 16, desirably made from fused silica. A means for heating crucible 6 to a growth temperature is disposed in operative relation to chamber 16, which desirably is water-cooled. Heating means can be realized in any suitable and/or desirable manner, such as RF coil 12, or a resistive heater or RF coil (not shown) located inside chamber 16.

In order to initiate sublimation growth, crucible 6 is heated by the heating means to a growth temperature, desirably between 2000° C. and 2400° C., in the presence of an inert gas 22, such as argon or helium gas, inside crucible 4 at a pressure between 1-200 Torr. Under these conditions, source material 4 sublimes and fills the interior of crucible 6 with vapor including Si, $Si_2C$ and $SiC_2$ volatile molecules. During growth of a SiC single crystal 14, the temperature of source material 4 is kept higher than the temperature of seed crystal 8. This results in vapor transport in the direction from source material 4 to seed crystal 8. After reaching seed crystal 8, the vapors condense thereon causing growth of SiC single crystal 14 on seed crystal 8.

During growth of single crystal 14, inert gas 22 is supplied to growth crucible 4 by passing first through an inlet 24 of chamber 16. Inert gas 22 inside chamber 20 permeates through the material comprising growth crucible 4 into the interior thereof.

After establishing proper conditions for the growth of SiC single crystal 14 inside growth crucible 4, a valve 26 connected to a nitrogen gas source 28 is opened for a predetermined time interval, desirably between 1 minute and 1 hour. Opening valve 26 enables a predetermined amount of nitrogen to enter chamber 16 and, hence, growth crucible 6. Graphite has a high permeability to gases, such as argon, helium and nitrogen. Therefore, upon opening valve 26, nitrogen appears at the crystal growth interface almost immediately. A mass flow controller (MFC) (not shown) can be used to control the pressure of gas inside chamber 16 and, hence, growth crucible 6 to avoid inadvertent changes in this pressure in response to the addition and subtraction of nitrogen to and from the flow of inert gas 22 into chamber 16.

Nitrogen is a known donor in SiC that causes: an increase in the electrical conductivity of SiC; a visible change in the crystal color to green; and a slight change in the lattice parameter.

After closing valve 26, the growth of SiC single crystal 14 continues in the presence of a flow of 1-200 Torr of inert gas 22 in growth crucible 6, as in a conventional growth process. Upon closing valve 26, the nitrogen remaining in chamber 16 and growth crucible 6 is quickly removed by the flow of inert gas 22 which is introduced into chamber 16 via inlet 24 and which exits chamber 16 via outlet 30.

After a suitable time interval, e.g., several hours, of undisturbed growth in the presence of a flow of inert gas 22, valve 26 is opened again for the same or another predetermined time interval, whereupon nitrogen flows into chamber 16 and, hence, into growth crucible 6 again. The foregoing step-wise nitrogen doping cycle is repeated multiple times during the growth of SiC single crystal 14.

Figure 5:
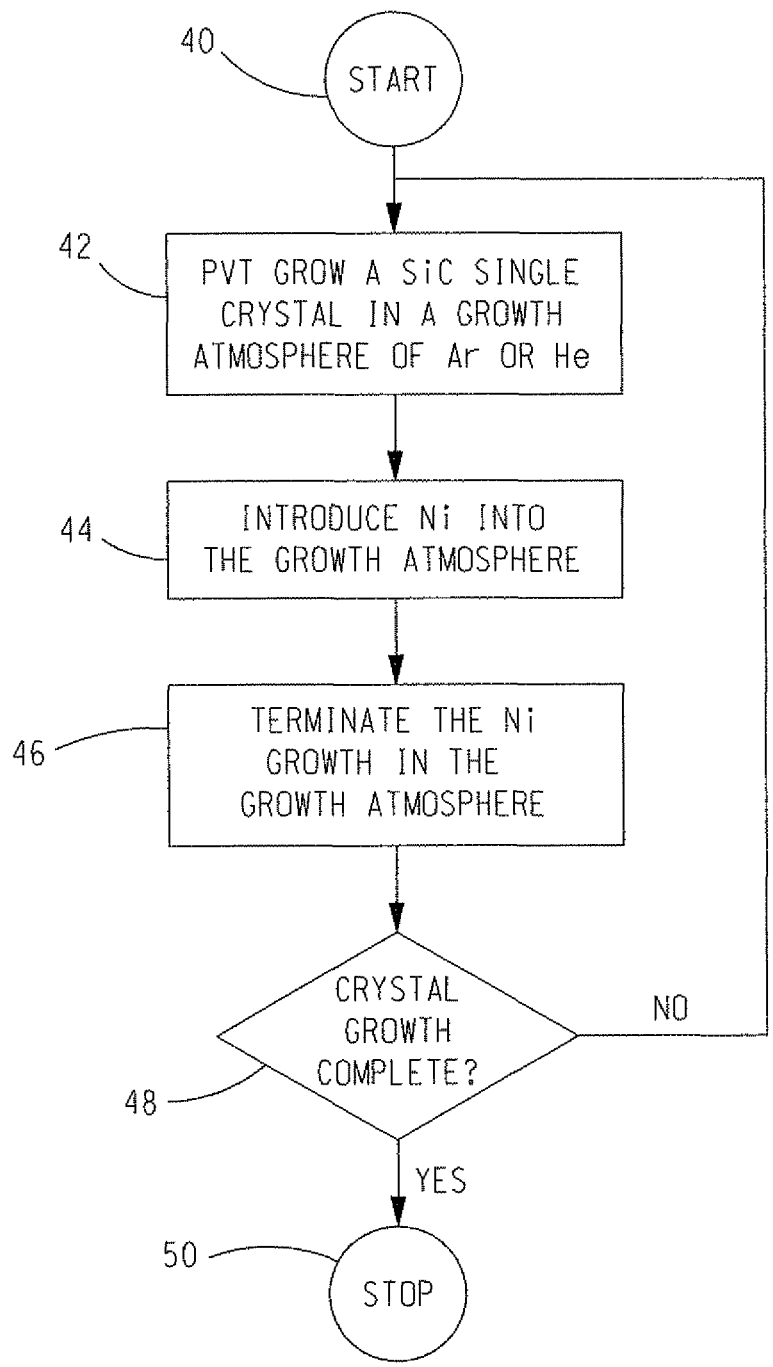
FIG. 5 is a flowchart of a method for perturbation growth of SiC single crystals in accordance with an embodiment of the present invention.

A method of PVT growth of a SiC single crystal by intermittently introducing nitrogen into growth crucible 6 is shown in the flowchart of FIG. 5, wherein the method commences by advancing from start step 40 to step 42 where PVT growth of a SiC single crystal in a growth atmosphere of between 1 to 200 Torr of a flow of argon or helium gas occurs.

The method then advances to step 44 wherein nitrogen is introduced into the growth atmosphere. It is envisioned that at the commencement of the SiC single crystal growth process, steps 42 and 44 can be carried out at the same time, whereupon the initial growth atmosphere can include the combination of nitrogen and argon or helium. Alternatively, the initial growth of the SiC single crystal can occur in a growth atmosphere of only argon or helium and, at a suitable time after the commencement of the SiC single crystal growth, nitrogen can be introduced into the growth atmosphere.

The method then advances to step 46 wherein the introduction of nitrogen into the growth atmosphere is terminated.

In step 48, a determination is made whether the growth of the SiC single crystal is complete. If so, the method advances to stop step 50. Otherwise, the method returns to step 42.

Steps 42-48 are then repeated any suitable and/or desirable number of times until, in an iteration of step 48, it is determined that the growth of SiC single crystal is complete, whereupon the method advances to stop step 50.

In the method, the introduction of nitrogen into the growth atmosphere can occur at periodic intervals (at regular intervals) or at random intervals (at irregular intervals) as deemed suitable and/or desirable by one of ordinary skill in the art. In addition, each interval of crystal growth in the presence of nitrogen can be the same duration or a different duration than any other interval of crystal growth in the presence of nitrogen. Similarly, each interval of crystal growth in the absence of nitrogen in the growth atmosphere can be the same duration or a different duration than any other interval of crystal growth in the absence of nitrogen in the atmosphere.

SiC single crystal growth runs were performed in accordance with the above described embodiment. In one growth run, a 6H—SiC single crystal Boule was grown in an atmosphere of pure helium at 30 Torr. The seed crystal and source material temperatures were at 2090° C. and 2130° C., respectively. During growth of the single crystal, the interface was perturbed by admitting nitrogen into the growth atmosphere and simultaneously increasing the total gas pressure in the chamber from 30 Torr to 50 Torr. This step-wise perturbation was repeated twice.

Figure 6:
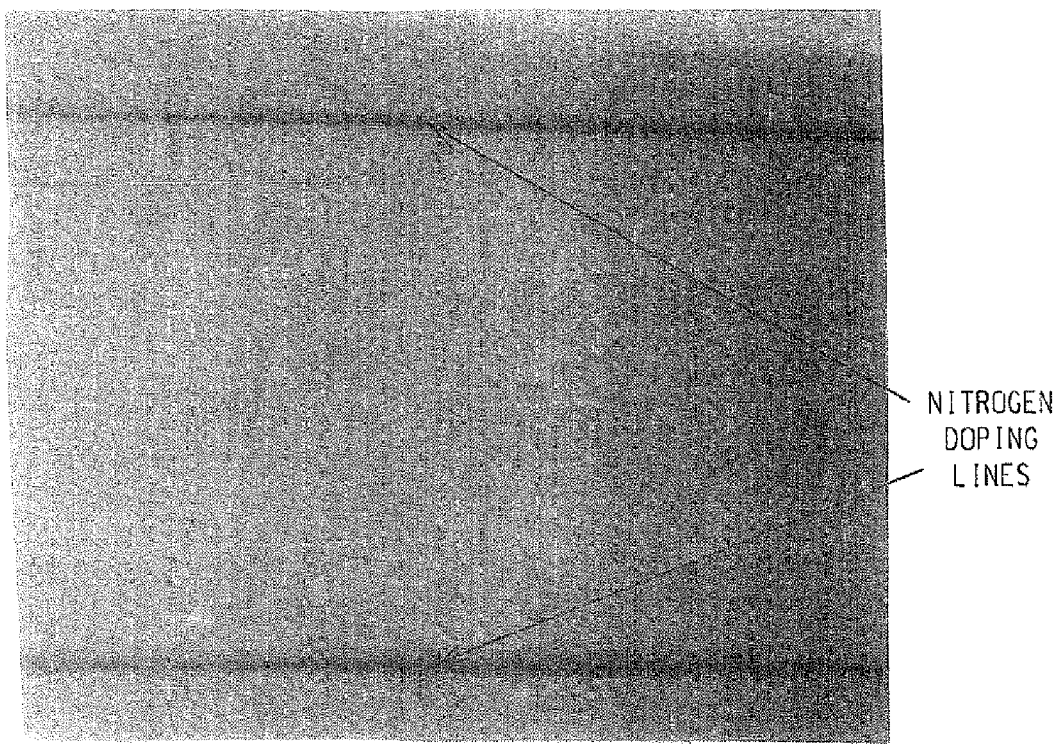
FIG. 6 is a cross section of a Boule grown in accordance with the disclosed method.
Figure 7A:
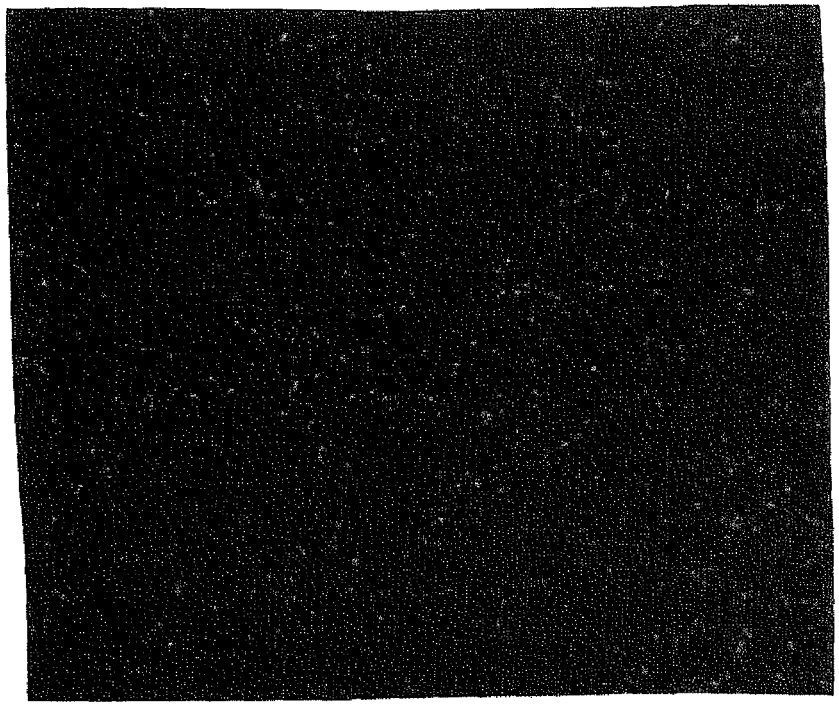
FIGS. 7A and 7B are enlarged photographs of a second-to-grow wafer and one of the last-to-grow wafers, respectively, obtained from the Boule of FIG. 6.
Figure 7B:
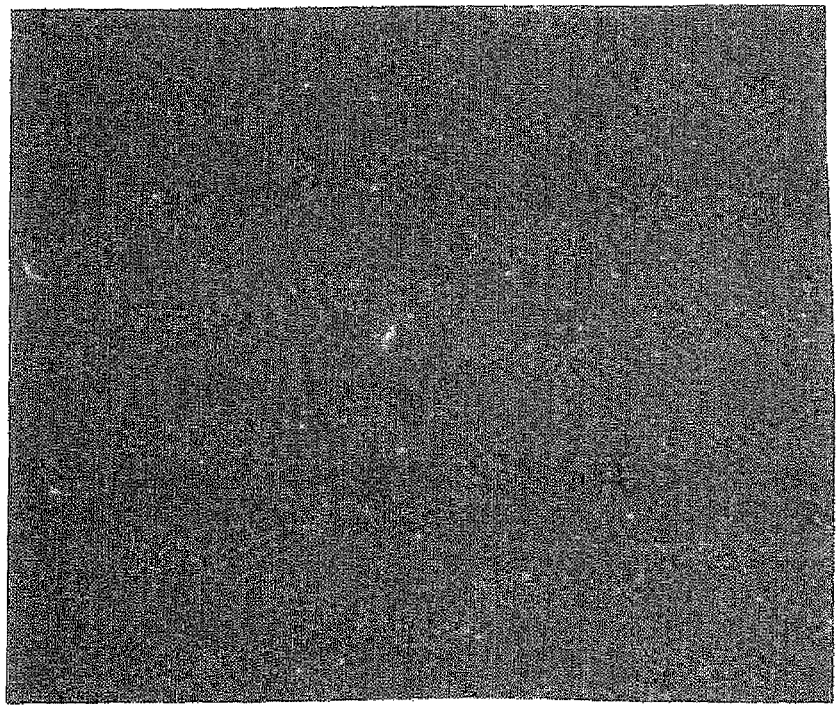

In a second growth run, a 6H—SiC single crystal Boule was grown in a growth atmosphere in which nitrogen gas was intermittently introduced. Specifically, the Boule was grown at a seed crystal temperature of 2140° C. and a source material temperature of 2190° C. in a helium ambient of 10 Torr at a flow rate of 248 standard cubic centimeters per minute (sccm). The seed crystal was approximately 1.5 millimeters thick. The source was polycrystalline SiC powder. During a 200 hour growth run, nitrogen pulses of 5 sccm and one minute duration were introduced into the growth atmosphere approximately every 20 hours. Cross sections of the Boule were prepared and studied under a microscope. FIG. 6 is a photograph of the Boule cross section. The photograph shows two horizontal lines, which correspond to the times when nitrogen was introduced into the growth atmosphere. In this run, a total of 10 "pulses" of nitrogen were periodically or intermittently introduced into the growth atmosphere. Wafers from this Boule were sliced and etched in molten KOH. Etched wafers number 2 and number 17 were examined under a microscope. Photographs of wafers numbers 2 and 17 as viewed under the microscope are shown in FIGS. 7A and 7B, respectively. As can be seen, wafer number 17 has a significantly reduced dislocation density as compared to wafer number 2. It should be recognized that wafer number 2 is at the beginning of the Boule growth, whereas wafer number 17 is near the end of the Boule growth. Although it is difficult to ascertain the nature of the dislocations associated with the etch pits shown in wafers numbers 2 and 17, a close inspection reveals that a vast majority of them are of the threading type, i.e., either TSD or TED. This is not unexpected because the Boule was sliced parallel to its c-axis, and very few of the BPD's would be visible. Therefore, the observed reduction in etched pit density indicated a reduction in TSD and/or TED.

In summary, disclosed herein is a SiC sublimation crystal growth process in which the growth is periodically or intermittently perturbed by step-wise periodic change in the growth conditions. Also disclosed is a SiC sublimation crystal growth process in which the periodic or r intermittent perturbation of growth is caused by a step-wise change in doping level. Desirably, the growth atmosphere is an inert gas, such as argon or helium, and the dopant is a gas or vapor, desirably nitrogen gas. The growth atmosphere can also be a mixture of inert gas with hydrogen.

Also or alternatively to perturbation by the introduction of nitrogen into growth crucible 6, perturbation can also be accomplished by changing the pressure inside growth crucible 6 and/or by changing the temperature inside growth crucible 6. For example, after establishing suitable conditions for growth of the SiC single crystal 14 inside crucible 6, perturbation in the growth condition(s) can be caused by increasing and/or decreasing the temperature inside crucible 6 by no more than 100° C., desirably, between 10° C. and 50° C., and more desirably between 25° C. and 50° C. Perturbation by increasing and/or decreasing the temperature during the perturbation interval and then returning the temperature to its starting temperature can occur a plurality of regular and/or irregular intervals of time during the growth of SiC single crystal 14 in crucible 6. The duration of each perturbation interval can be the same or different.

Also or alternatively, after establishing proper conditions for the growth of SiC single crystal 14 inside crucible 6, perturbation in the growth condition(s) can be caused by increasing or reducing the pressure inside crucible 6 by not more than 100 Torr, desirably between 2 Torr and 50 Torr, and more desirably between 5 Torr and 20 Torr. Perturbation by increasing and/or reducing the pressure inside crucible 6 and then returning the pressure inside crucible 6 to its starting condition can occur a plurality of regular and/or irregular intervals of time during the growth of SiC single crystal 14 in crucible 6. The duration of each perturbation interval can be the same or different.

Heretofore, perturbation of the growth conditions by changing the growth atmosphere, the growth pressure or the growth temperature inside growth crucible 6 were described separately. However, perturbation of the growth conditions can be accomplished by changing any two or more of the atmosphere, the pressure and/or the temperature inside growth crucible 6 during the growth of SiC single crystal 14. For example, without limitation, when growth pressure is reduced, the temperatures of seed crystal 8 and source material 4 will increase correspondingly if a constant power is maintained to the heating means. Similarly, increasing the temperature inside crucible 6 will cause the pressure inside crucible 6 to increase. Thus, one of the parameters (temperature and pressure) may be adjusted deliberately while the other is allowed to change naturally. Alternatively, the temperature may be adjusted while the pressure is held constant. Still further, both temperature and pressure may be adjusted in concert to achieve perturbation. Accordingly, accomplishing perturbation by changing any one or more of the atmosphere, the pressure and/or the temperature inside crucible 6 is envisioned.

As can be seen, perturbation growth of a SiC single crystal by PVT will lead to reduced dislocation density and improved crystal quality of the SiC single crystal substrate, especially with regard to 4H—SiC substrates used for power-switching semiconductor devices.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A SiC PVT crystal growth method comprising:
(a) providing a SiC seed crystal and SiC source material in spaced relation inside of a growth crucible;
(b) establishing in the growth crucible starting conditions for PVT growth of a SiC crystal therein, said starting conditions comprising: (1) a suitable gas inside the growth crucible, (2) a suitable total pressure of the gas inside the growth crucible, and (3) a suitable temperature in the growth crucible that causes the SiC source material to sublimate and be transported via a temperature gradient in the growth crucible to the SiC seed crystal where the sublimated SiC source material precipitates to form the growing SiC crystal; and
(c) intermittently changing at least one of the following growth conditions inside the growth crucible a plurality of times during growth of the SiC crystal; an amount of a dopant gas comprising the gas in the growth crucible, the total pressure of the gas in the growth crucible, and the temperature in the growth crucible, wherein each instance of intermittently changing at least one of the growth conditions includes changing said at least one growth condition from its starting growth condition and then returning the changed growth condition back to its starting growth condition after a period of time that is on the order of minutes or hours.

2. The method of claim 1, wherein the period of time is the same or different for each instance of intermittently changing.

3. The method of claim 1, wherein:
the suitable gas in step (b) includes at least one of the following: helium, argon and hydrogen; and
the dopant gas in step (c) is nitrogen.

4. The method of claim 1, wherein:
the suitable total gas pressure in step (b) is a first pressure between 1 Torr and 200 Torr; and
changing the pressure of the gas in step (c) includes increasing the total gas pressure from the first pressure to a second pressure between 1 Torr and 200 Torr.

5. The method of claim 1, wherein:
the suitable temperature in step (b) is a first temperature between 2000° C. and 2400° C.; and
changing the temperature in step (c) includes increasing or decreasing the temperature from the first temperature to a second temperature between 2000° C. and 2400° C.

6. The method of claim 1, wherein:
the growth crucible is disposed inside of a chamber into which the gas is introduced; and
the growth crucible is comprised of a material that is permeable to the gas.

7. The method of claim 6, wherein:
the chamber is comprised of fused silica; and
the growth crucible is comprised of graphite.

8. A SiC PVT crystal growth method comprising:
(a) providing a growth crucible having polycrystalline SiC source material and a SiC seed crystal disposed in spaced relation therein;
(b) heating the interior of the growth crucible such that a temperature gradient forms in the growth crucible between the SiC source material and the SiC seed crystal, the SiC source material is heated to a sublimation temperature and the temperature gradient is sufficient to cause sublimated SiC source material to be transported to the SiC seed crystal where the sublimated SiC source material precipitates on the SiC seed crystal to form a growing SiC crystal;
(c) causing a gas to flow into the growth crucible that facilitates the transport of the sublimated SiC source material to the SiC seed crystal and the precipitation of the sublimated SiC source material on the SiC seed crystal; and
(d) at plural times during the transport of the sublimated SiC source material to the SiC seed crystal and the precipitation of the sublimated SiC source material on the SiC seed crystal, changing at least one of the following from a starting condition and then returning the changed condition back to its starting condition: an amount of a dopant gas comprising the gas flowing into the growth crucible, a total pressure of the gas in the growth crucible, and at least one of the lowest and highest temperature of the temperature gradient in the growth crucible, wherein each said change is for a time interval that is on the order of minutes or hours.

9. The method of claim 8, wherein:
changing the amount of the dopant gas comprising the gas flowing into the growth crucible from the starting condition includes increasing or decreasing the amount of the dopant gas in the gas flowing into the growth crucible thereby causing at least one of the following: a change in an electrical conductivity of the growing crystal, a change in a visible color of the growing crystal, or a change in a lattice parameter of the growing crystal; and
returning the change in the amount of the dopant gas comprising the gas flowing into the growth crucible back to its starting condition includes decreasing or increasing, respectively, the amount of dopant gas in the gas flowing into the growth crucible.

10. The method of claim 9, wherein:

the dopant gas is nitrogen; and the gas of step (c) includes at least one of the following: helium, argon and hydrogen.

11. The method of claim 8, wherein:

changing the total pressure of the gas in the growth crucible from the starting condition includes increasing or decreasing the total pressure of the gas in the growth crucible from a first gas pressure to a second gas pressure; and returning the change in the total pressure of the gas in the growth crucible back to its starting condition includes decreasing or increasing, respectively, the total pressure of the gas in the growth crucible from the second gas pressure to the first gas pressure. gas pressure to the first gas pressure.

12. The method of claim 11, wherein each total gas pressure is between 1 Torr and 200 Torr.

13. The method of claim 8, wherein:

changing the at least one of the lowest and highest temperature of the temperature gradient in the growth crucible from a starting condition includes increasing the temperature of the lowest temperature, the highest temperature, or both; and returning the change in the at least one of the lowest and highest temperature of the temperature gradient in the growth crucible back to its starting condition includes decreasing the temperature of the lowest temperature, the highest temperature, or both back to the temperature(s) at the beginning of said change.

14. The method of claim 13, wherein:

the temperature gradient is between 10° C. and 50° C., or between 25° C. and 50° C.;

the lowest temperature of the temperature gradient is 2000° C.; and the highest temperature of the temperature gradient is 2400° C.

15. The method of claim 1, wherein the period of time is between one minute and one hour.

16. The method of claim 8, wherein the time interval is between one minute and one hour.

* * * * *

UNITED STATES PATENT AND TRADEMARK OFFICE
CERTIFICATE OF CORRECTION

PATENT NO. : 8,871,025 B2
APPLICATION NO. : 12/441583
DATED : October 28, 2014
INVENTOR(S) : Gupta et al.

Page 1 of 1

It is certified that error appears in the above-identified patent and that said Letters Patent is hereby corrected as shown below:

In the Claims,

Column 9, Line 56, Claim 1, delete "crystal;" and insert -- crystal: --

Column 11, Lines 19-21, Claim 11, delete "gas pressure to the first gas pressure. gas pressure to the first gas pressure." and insert -- gas pressure to the first gas pressure. --

Signed and Sealed this
Seventeenth Day of February, 2015

Michelle K. Lee
*Deputy Director of the United States Patent and Trademark Office*